United States Patent
Woo et al.

(10) Patent No.: US 7,071,086 B2
(45) Date of Patent: Jul. 4, 2006

(54) METHOD OF FORMING A METAL GATE STRUCTURE WITH TUNING OF WORK FUNCTION BY SILICON INCORPORATION

(75) Inventors: Christy Woo, Cupertino, CA (US); Paul Besser, Sunnyvale, CA (US); Minh van Ngo, Fremont, CA (US); James Pan, Santa Clara, CA (US); Jinsong Yin, Sunnyvale, CA (US)

(73) Assignee: Advanced Micro Devices, Inc., Sunnyvale, VA (US)

( * ) Notice: Subject to any disclaimer, the term of this patent is extended or adjusted under 35 U.S.C. 154(b) by 162 days.

(21) Appl. No.: 10/420,721

(22) Filed: Apr. 23, 2003

(65) Prior Publication Data

US 2004/0214416 A1 Oct. 28, 2004

(51) Int. Cl.
*H01L 21/3205* (2006.01)
(52) U.S. Cl. .................................... 438/592
(58) Field of Classification Search ......... 438/585–595
See application file for complete search history.

(56) References Cited

U.S. PATENT DOCUMENTS

| | | | |
|---|---|---|---|
| 6,017,818 A | 1/2000 | Lu | |
| 6,271,136 B1 | 8/2001 | Shue et al. | |
| 6,420,236 B1 | 7/2002 | Hu et al. | |
| 6,423,619 B1 | 7/2002 | Grant et al. | |
| 6,436,825 B1 | 8/2002 | Shue | |
| 6,528,426 B1 | 3/2003 | Olsen et al. | |
| 2002/0168468 A1 | 11/2002 | Chou et al. | |
| 2004/0175910 A1* | 9/2004 | Pan et al. | 438/592 |

FOREIGN PATENT DOCUMENTS

JP P2001-77355 A 2/2001

OTHER PUBLICATIONS

Hitoshi Wakabayashi et al., "A Dual-Metal Gate CMOS Technology Using Nitrogen-Concentration-Controlled TiNx Film", IEEE Transactions On Electron Devices, vol. 48, No. 10, Oct. 2001, pp. 2363-2369.

James Pan et al., "A Low-Temperature Metal-Doping Technique for Engineering the Gate Electrode of Replacement Metal Gate CMOS Transistors", IEEE Electron Device Letters, vol. 24, No. 9, Sep. 2003, pp. 547549.

* cited by examiner

*Primary Examiner*—Richard A. Booth

(57) ABSTRACT

A method for forming a semiconductor structure having a metal gate with a controlled work function includes the step of forming a precursor having a substrate with active regions separated by a channel, a temporary gate over the channel and within a dielectric layer. The temporary gate is removed to form a recess with a bottom and sidewalls in the dielectric layer. A non-silicon containing metal layer is deposited in the recess. Silicon is incorporated into the metal layer and a metal is deposited on the metal layer. The incorporation of the silicon is achieved by silane treatments that are performed before, after or both before and after the depositing of the metal layer. The amount of silicon incorporated into the metal layer controls the work function of the metal gate that is formed.

14 Claims, 2 Drawing Sheets

METHOD OF FORMING A METAL GATE STRUCTURE WITH TUNING OF WORK FUNCTION BY SILICON INCORPORATION

FIELD OF THE INVENTION

The present invention relates to the field of semiconductor processing, and more particularly, to the formation of metal gate electrodes using the replacement gate process technique.

BACKGROUND OF THE INVENTION

In the integrated circuit (IC) industry, metal-oxide-semiconductor, (MOS) transistors have typically been formed utilizing polysilicon gate electrodes. Polysilicon material has been preferred for use as a MOS gate electrode due to its thermal resistive properties (i.e., polysilicon can better withstand subsequent high temperature processing). Polysilicon's robustness during high temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed. However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates cannot withstand the higher temperatures and oxidation ambients that can be withstood by conventional polysilicon gate electrodes. In efforts to avoid some of these concerns with polysilicon gate electrodes, a replacement damascene metal gate process has been created. A damascene gate process uses a disposable gate, and is formed with a source, drain, spacer, etch stops and anti-reflective coatings as in conventional processing. The disposable gate and dielectrics are etched away, exposing an original gate oxide. The disposable polysilicon gate is then replaced by a metal gate to achieve the lower resistivity provided by the metal material.

A design consideration in semiconductor technology is that of the work function, which is the amount of energy required to excite electrons across a threshold. Polysilicon gates on silicon substrates provide a work function that allows the gates to be adequately controlled. The use of metal, however, as the gate material on a silicon substrate may undesirably change the work function in comparison to polysilicon gates. This reduces the controllability of the gate.

SUMMARY OF THE INVENTION

There is a need for a semiconductor structure and method of making the same in which the gate is made of a metal, but the work function is tunable to a desired value in a highly controllable manner.

This and other needs are met by embodiments of the present invention which provide a method of forming a semiconductor structure comprising the steps of forming a precursor having a substrate with active regions separated by a channel, and a temporary gate over the channel and within a dielectric layer. The temporary gate is removed to form a recess with a bottom and sidewalls in the dielectric layer. A non-silicon containing metal layer is then deposited in the recess. A metal is deposited on the metal layer and silicon is incorporating into the metal layer. In certain embodiments of the invention, the incorporation of the silicon includes a thermal silane treatment. This thermal silane treatment may include a pre-soak, a post-soak, or a combination of pre-soaks and post-soaks. In other embodiments of the invention, the thermal silane treatment includes a plasma treatment of the deposited non-silicon containing metal layer. The plasma treatment may be combined with a thermal soak treatment.

The incorporation of silicon into the metal layer, which may be made of Ta, W, Mo, Ru, Ti and Co, for example, provides a high degree of control over the work function of the metal layer in the recess. The amount of silicon incorporated into the metal layer can be controlled in a number of different ways, including controlling the number of silane treatments. Other methods of controlling the amount of silicon incorporation include controlling the silane treatment time, and controlling the silane treatment temperature. Another method of controlling the amount of silicon incorporation is to control the thickness of the non-silicon containing metal layer. The thinner the layer, the greater the percentage of silicon that will be incorporated into the metal layer.

The earlier stated needs are also met by other embodiments of the present invention which provide a method of forming a metal gate semiconductor device comprising the steps of forming a metal gate on a precursor and thermally treating the metal gate with silane to controllably tune the work function of the metal gate.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of metal gates in semiconductor structures. In a conventional semiconductor structure using replacement metal gates, the work function is changed from a polysilicon gate due to the use of metal on a silicon substrate. The present invention provides a tunable work function to create a metal gate with a work function that is specifically tuned to a desired value. This is achieved by performing a silane treatment in a controlled manner to incorporate silicon into a metal layer, such as tantalum, which has been deposited within a damascene gate structure. Hence, the metal gate technique of the present invention provides the feasibility of modifying the threshold voltage of very small CMOS devices without performing additional adjustment implants. This is advantageous since the degrees of freedom for channel implants decrease drastically with aggressive scaling of the CMOS channel length.

Figure 1:
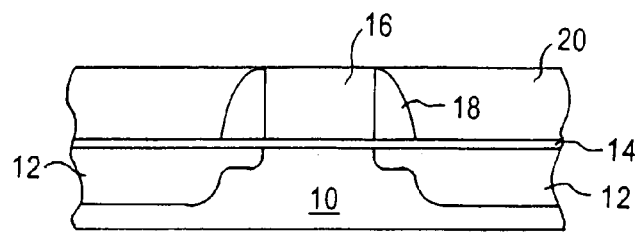
FIG. 1 is a schematic depiction of a cross-section of a semiconductor structure precursor in accordance with embodiments of the present invention.

FIG. 1 is a cross-section of a precursor for the semiconductor structure constructed in accordance with embodiments of the present invention. In the following description, the features and the drawings are not necessarily represented accurately in terms of relative sizes or shapes, but have been rendered for illustrative purposes.

In FIG. 1, a silicon substrate 10 has active regions 12 formed therein by conventional doping techniques. A gate oxide 14 has been provided on the surface of the substrate 10. Silicide regions 15 are formed on the active regions 12. A polysilicon gate 16, which serves as a temporary (or "dummy") gate is provided on top of the gate oxide 14.

Spacers 18 are provided on the sidewalls of the gate 16. Spacers 18 may be made of any suitable material, such as silicon nitride, silicon oxide, silicon oxynitride, or different layers thereof. Dielectric layer 20 is provided on top of the substrate 10. The semiconductor structure of FIG. 1 has been planarized, by chemical mechanical planarization (CMP), for example, to provide a planarized upper surface.

The structure of FIG. 1 is a conventional semiconductor structure with active regions and a polysilicon gate. In order to provide a gate with reduced resistivity, however, the polysilicon gate 16 may be removed and replaced by a metal gate, as provided for in the present invention. As noted earlier, however, the use of a metal gate structure may undesirably change the work function of the gate. This is avoided in the present invention by the silane treatment of the metal gate to tune the work function to a desired value.

Figure 2:
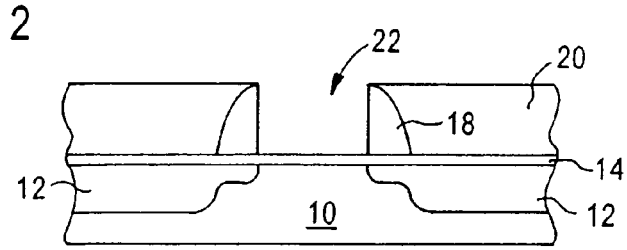
FIG. 2 depicts the structure of FIG. 1 after the dummy gate and the gate dielectric have been removed.

In FIG. 2, the polysilicon gate 16 has been removed from the region between spacers 18. The gate oxide 14 is depicted in FIG. 2 as remaining within the recess 22 that is formed by the top of the substrate 10 and the sidewalls formed by the spacers 18. In certain embodiments of the present invention, the gate oxide 14 is removed and replaced with a high-k gate dielectric material. The particular materials that may be used in the high-k gate dielectric layer include $ZrO_2$, $HfO_2$, $InO_2$, $LaO_2$, $TaO_2$, for example. Other multiple metal oxides may be used or perovskites may be employed as a high-k gate dielectric material instead of conventional gate oxide. In the following description, however, it is assumed that the gate oxide 14 has not been removed.

Figure 3A:
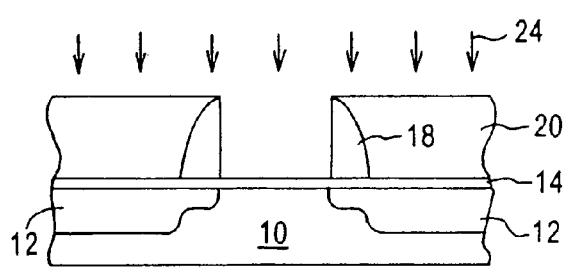
FIG. 3A depicts the structure of FIG. 2 undergoing a silane treatment in accordance with certain embodiments of the present invention.
Figure 3B:
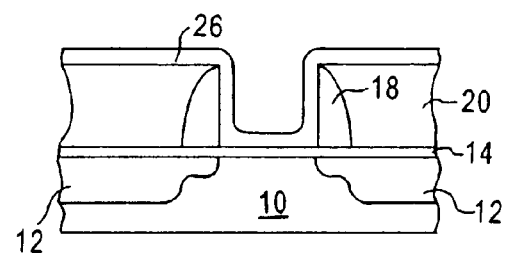
FIG. 3B depicts the structure of FIG. 2 following the deposition of a metal layer in accordance with certain other embodiments of the present invention.

FIGS. 3A and 3B depict the structure of FIG. 2 on a next step in the process according to different embodiments of the present invention. In FIG. 3A, a first silane treatment is performed. This is indicated by arrows 24 in FIG. 3A. The silane treatment is considered a pre-soak and may be performed in accordance with the following parameters: pressure of about 3 to about 6 torr; temperature between about 250–550° C.; $SiH_4$ flow between about 400 to about 1000 seem, and treatment time of between about 10 to about 60 seconds.

Following the pre-soak silane treatment of FIG. 3A, a metal layer 26 is then formed within the recess 22 and on top of the dielectric layer 20. A conventional process may be employed to deposit the metal layer 26, such as sputter deposition by physical vapor deposition. The metal layer 26 is made of a suitable material, such as Ta, W, Mo, Ru, Ti, TiN, TaN or Co, for example. The relatively thin layer may be deposited, for example between about 10 Å and about 100 Å, for example.

Figure 4A:
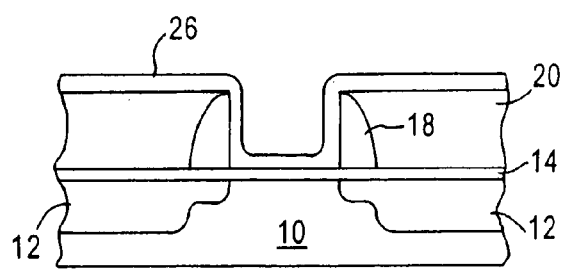
FIG. 4A depicts the structure of FIG. 3A after the deposition of a metal layer in accordance with certain embodiments of the present invention.

The pre-soak formed in FIG. 3A causes the metal layer 26 of FIG. 4A to incorporate silicon (Si) during the deposition, so that the metal layer 26 that is actually formed includes silicon. For example, the metal layer 26 after formation following the pre-soak of FIG. 3A may be TaSi, WSi, MoSi, RuSi, TiSi, TiNSi, TaNSi or CoSi, for example. Incorporation of silicon changes the work function to a desired value set by the designer. This provides a fine tuning of the work function of the metal gate that will be formed.

Figure 4B:
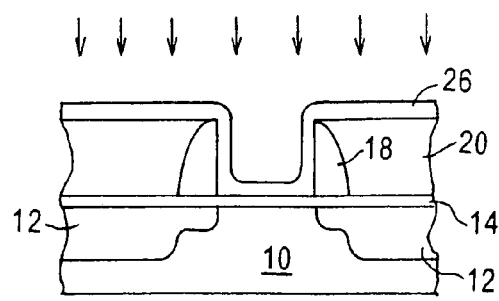
FIG. 4B depicts the structure of FIG. 3B during a silane treatment of a deposited metal layer, in accordance with certain other embodiments of the present invention.

In alternate embodiments of the present invention, as depicted in FIGS. 3B and 4B, the metal layer 26 is deposited prior to any silane treatments. The metal layer 26 may be the same material as that employed in the metal layer 26 of FIG. 4A, hence the same reference numeral designation is provided for this layer. However, the metal layer 26 does not have any incorporated silicon in FIG. 3B.

In FIG. 4B, a post-soak or plasma silane treatment is provided to incorporate silicon into the metal layer 26. The final metal layer 26 will therefore be comprised of the same material as metal layer 26 of FIG. 4A. The same parameters for the pre-soak silane treatment may be used for the post-soak silane treatment. Parameters for a silane plasma treatment in a PECVD chamber are as follows: pressure is between about 2 to about 4 torr; temperature is between about 350° C. to about 450° C.; RF power is between about 100 to about 250 W; $SiH_4$ flow is between about 60 to about 110 seem and the time is between about 5 to about 30 seconds. These parameters are exemplary only, however, as other parameters may be employed without departing from the scope of the present invention.

The embodiments of FIGS. 3A and 4B are combined in certain embodiments, such that the process includes a pre-soak as well as a post-soak or post-plasma treatment. Changing the total number of silane treatments on the metal layer 26 changes the amount of silicon that is incorporated into the metal layer 26. This has the effect of providing a control of the work function of the metal layer 26, providing the designer flexibility in selecting the work function value.

Figure 5:
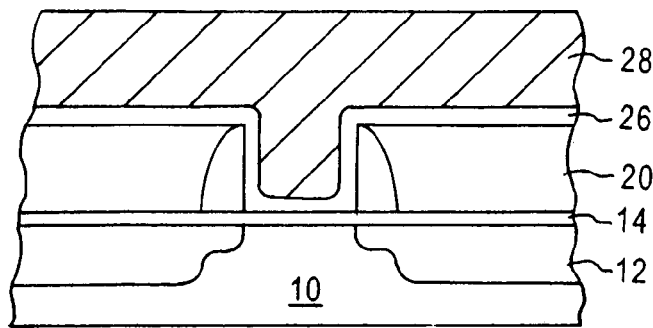
FIG. 5 depicts the structure of either FIG. 4A or FIG. 4B following the deposition of a metal on top of the metal layer in accordance with embodiments of the present invention.

FIG. 5 shows the structure of FIG. 4A or 4B following the deposition of another metal layer 28 on the metal layer 26 with the incorporated silicon. The metal layer 28 comprises a material that is compatible with the metal layer 26. For example, metal layer 28 may be made of tantalum, or copper or copper alloy. A conventional deposition technique may be employed to deposit the metal layer 28, such as physical vapor deposition, chemical vapor deposition, or electroless deposition (for copper). Another suitable material for the metal layer 28 is tungsten (W) and may be deposited by CVD.

Following the deposition of the metal layer 28, a planarization process, such as chemical mechanical planarization (CMP), is performed to create the metal gate 30 comprising the metal layer 28 and the metal layer 26 with the incorporated silicon.

The present invention allows a designer to tailor the work function of the metal gate 30 by controlling the amount of silicon added to the metal layer 26. For example, the number of silane treatments may be varied. A pre-treatment may be employed, a post-treatment may be employed or both pre- and post-treatments may be used. The number of treatments will have an effect on the amount of incorporated silicon in the metal layer 26, and thus, the work function of the metal gate.

Also, the silane treatment time will have an effect on the amount of silicon incorporation. A greater amount of silicon is incorporated into the metal layer 26 with a longer silane treatment time. Similarly, the treatment temperature of the silane treatments will affect the amount of silicon incorporation. At higher temperatures, a greater amount of silicon is incorporated. One of ordinary skill in the art may vary the temperatures depending upon the metal layer 26 that is used to obtain a work function that is desired.

Another factor is the thickness of the metal layer 26. A thinner metal layer 26 allows for greater silicon incorporation into the metal layer 26. This provides another parameter by which the work function may be controlled.

Figure 6:
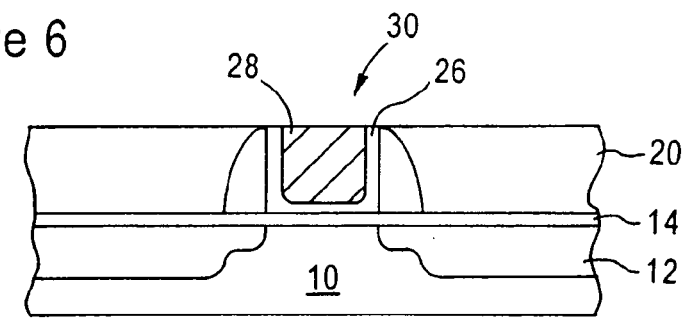
FIG. 6 shows the structure of FIG. 5 after planarization to form the metal gate.
Figure 7:
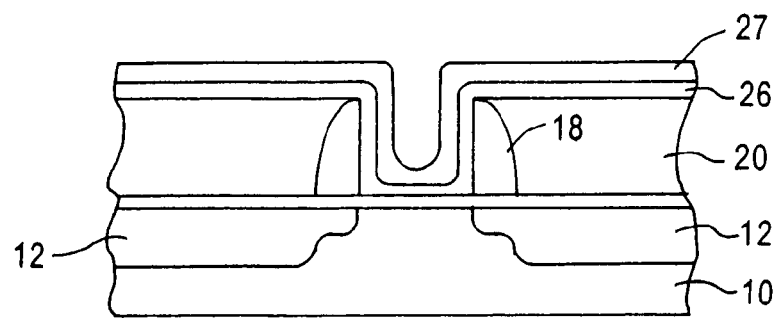
FIG. 7 shows a processing step in an alternate embodiment of the present invention.

In alternate embodiments of the invention, as depicted in FIG. 7, an alternate method of forming a layer with incorporated silicon is provided. In this method, as depicted in FIG. 7 which follows FIG. 3B in sequence, a layer of silicon 27 is deposited onto the wafer employing physical vapor deposition, for example. This step is performed in-situ employing standard UHV multi-chamber sputter systems that are commercially available. A short annealing step is then performed by a rapid thermal anneal (RTA), for example. The temperature is maintained between about 300° C. to about 500° C. during this short anneal. The silicon in the layer 27 reacts with the metal layer 26, but does not form a silicide since the temperature is maintained below the temperature required for silicidation. After the annealing, by which the silicon in the layer 27 is incorporated into the metal layer 26, the manufacturing process continues with FIG. 5 in which metal layer 28 is deposited and then planarized in FIG. 6.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming a semiconductor structure comprising the steps of forming a precursor having a substrate with active regions separated by a channel, and a temporary gate over the channel and within a dielectric layer:
   removing the temporary gate to form a recess with a bottom and sidewalk in the dielectric layer;
   pre-soaking the recess with silane ($SiH_4$);
   depositing a non-silicon metal containing metal layer in the recess after the recess has been pre-soak with silane;
   depositing a metal on the metal layer; and
   incorporating silicon into the metal layer; the incorporating including at least incorporating silicon provided by the pre-soaking of the recess.

2. The method of claim 1, wherein the step of incorporating silicon further includes a pre-soak with $SiH_4$ after the depositing of the non-silicon containing metal layer.

3. The method of claim 2, wherein the step of incorporating silane further includes a plasma treatment alter the depositing of the non-silicon containing metal layer.

4. The method of claim 1, wherein the step of incorporating silicon includes a plasma treatment after the deposition of the non-silicon containing metal layer.

5. The method of claim 1, further comprising controlling an amount of silicon incorporation by controlling a number of silane treatments.

6. The method of claim 5, wherein multiple silane treatments are performed on the metal layer.

7. The method of claim 1, further comprising controlling silane treatment time to control an amount of silicon incorporation.

8. The method of claim 1, further comprising controlling silane treatment temperature to control an amount of silicon incorporation.

9. The method of claim 8, wherein the silane treatment temperature is controlled to be between about 250° C. to about 550° C.

10. The method of claim 1, further comprising controlling the thickness of the non-silicon containing metal layer to control an amount of silicon incorporation.

11. The method of claim 1, wherein the non-silicon containing metal layer includes one of Ta, W, Mo, Ru, Ti, TiN, TaN and Co.

12. The method of claim 2, wherein the non-silicon containing metal layer includes one of Ta, W, Mo, Ru, Ti, TiN, TaN and Co.

13. The method of claim 12, wherein the metal deposited on the metal layer is CU or a CU alloy.

14. The method of claim 1, further comprising controlling silane treatment time to control an amount of silicon incorporation.

* * * * *